(12) United States Patent
Wu et al.

(10) Patent No.: US 7,968,871 B2
(45) Date of Patent: Jun. 28, 2011

(54) ORGANIC THIN FILM TRANSISTOR

(75) Inventors: Yiliang Wu, Mississauga (CA);
Hualong Pan, Ottawa (CA); Ping Liu,
Mississauga (CA); Yuning Li,
Mississauga (CA)

(73) Assignee: Xerox Corporation, Norwalk, CT (US)

( * ) Notice: Subject to any disclaimer, the term of this patent is extended or adjusted under 35 U.S.C. 154(b) by 529 days.

(21) Appl. No.: 12/101,942

(22) Filed: Apr. 11, 2008

(65) Prior Publication Data
US 2009/0256138 A1    Oct. 15, 2009

(51) Int. Cl.
*H01L 51/30* (2006.01)

(52) U.S. Cl. ............ 257/40; 257/E51.006; 257/E51.029

(58) Field of Classification Search .............. 257/40, 257/E51.001–E51.052; 438/99
See application file for complete search history.

(56) References Cited

U.S. PATENT DOCUMENTS

| | | | |
|---|---|---|---|
| 6,433,359 B1 * | 8/2002 | Kelley et al. ................... 257/40 |
| 6,913,710 B2 | 7/2005 | Farrand et al. | |
| 7,435,989 B2 * | 10/2008 | Nakayama et al. ............. 257/40 |
| 7,800,102 B2 * | 9/2010 | Park et al. ....................... 257/40 |
| 2003/0102472 A1 * | 6/2003 | Kelley et al. ................... 257/40 |
| 2004/0161873 A1 * | 8/2004 | Dimitrakopoulos et al. ... 438/99 |
| 2005/0082525 A1 | 4/2005 | Heeney et al. | |
| 2006/0160272 A1 * | 7/2006 | Effenberger et al. ......... 438/110 |
| 2006/0175603 A1 * | 8/2006 | Schmid et al. .................. 257/40 |
| 2009/0032809 A1 * | 2/2009 | Kim et al. ....................... 257/40 |

OTHER PUBLICATIONS

Pan, J., et al. "Low-Temperature, Solution-Processed, High-Mobility Polymer Semiconductors for Thin-Film Transistors." J. Am. Chem. Soc., vol. 129 (2007): pp. 4112-4113, Supporting Information.*
Ong, B.S., et al. "High-Performance Semiconducting Polythiophenes for Organic Thin-Film Transistors." J. Am. Chem. Soc., vol. 126 (2004): pp. 3378-3379, Supporting Information.*
Pan, H., et al. "Benzodithiophene Copolymer—A Low-Temperature, Solution-Processed High-Performance Semiconductor for Thin-Film Transistors." Adv. Funct. Mater., vol. 17 (2007): pp. 3574-3579.*
Wu et al., U.S. Appl. No. 11/586,449, filed Oct. 25, 2006, for "Electronic Devices".

* cited by examiner

*Primary Examiner* — Matthew W Such
(74) *Attorney, Agent, or Firm* — Fay Sharpe LLP

(57) ABSTRACT

Organic thin film transistors with improved mobility are disclosed. The semiconducting layer comprises a semiconductor material of Formula (I):

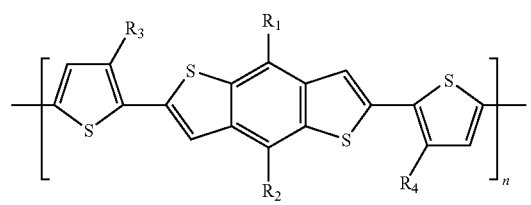

Formula (I)

wherein $R_1$ and $R_2$ are independently selected from alkyl, substituted alkyl, aryl, and substituted aryl; and $R_3$ and $R_4$ are independently selected from hydrogen, alkyl, substituted alkyl, aryl, and substituted aryl. A silanized interfacial layer is also present which has alkyl sidechains extending from its surface towards the semiconducting layer.

13 Claims, 2 Drawing Sheets

ORGANIC THIN FILM TRANSISTOR

BACKGROUND

The present disclosure relates, in various embodiments, to compositions and processes suitable for use in electronic devices, such as thin film transistors ("TFT"s). The present disclosure also relates to components or layers produced using such compositions and processes, as well as electronic devices containing such materials.

Thin film transistors (TFTs) are fundamental components in modern-age electronics, including, for example, sensors, image scanners, and electronic display devices. TFT circuits using current mainstream silicon technology may be too costly for some applications, particularly for large-area electronic devices such as backplane switching circuits for displays (e.g., active matrix liquid crystal monitors or televisions) where high switching speeds are not essential. The high costs of silicon-based TFT circuits are primarily due to the use of capital-intensive silicon manufacturing facilities as well as complex high-temperature, high-vacuum photolithographic fabrication processes under strictly controlled environments. It is generally desired to make TFTs which have not only much lower manufacturing costs, but also appealing mechanical properties such as being physically compact, lightweight, and flexible.

TFTs are generally composed of a supporting substrate, three electrically conductive electrodes (gate, source and drain electrodes), a channel semiconducting layer, and an electrically insulating gate dielectric layer separating the gate electrode from the semiconducting layer.

It is desirable to improve the performance of known TFTs. Performance can be measured by at least two properties: the mobility and the on/off ratio. The mobility is measured in units of $cm^2/V \cdot sec$; higher mobility is desired. The on/off ratio is the ratio between the amount of current that leaks through the TFT in the off state versus the current that runs through the TFT in the on state. Typically, a higher on/off ratio is more desirable.

BRIEF DESCRIPTION

The present disclosure is directed, in various embodiments, to a thin film transistor having an interfacial layer between the dielectric layer and the semiconducting layer that provides improved performance. The semiconducting layer comprises a specific genus of semiconducting material and the interfacial layer comprises a silane.

In one embodiment, a thin film transistor is disclosed which comprises a dielectric layer, an interfacial layer, and a semiconducting layer;
  wherein the interfacial layer is between the dielectric layer and the semiconducting layer;
  wherein the interfacial layer is formed from a silane; and
  wherein the semiconducting layer comprises a semiconductor of Formula (I):

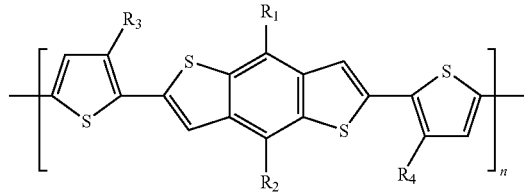

Formula (I)

wherein $R_1$ and $R_2$ are independently selected from alkyl, substituted alkyl, aryl, and substituted aryl; and $R_3$ and $R_4$ are independently selected from hydrogen, alkyl, substituted alkyl, aryl, and substituted aryl.

In another embodiment, the silane may be of Formula (II):

Formula (II)

where R' is alkyl having from about 1 to about 24 carbon atoms; R" is alkyl having from about 1 to about 24 carbon atoms, halogen, alkoxy, hydroxyl, or amino; L is halogen, alkoxy, hydroxyl, or amino; and m is an integer from 1 to 3.

In other embodiments, R' may be alkyl having from about 8 to about 18 carbon atoms, or about 12 carbon atoms. The silane may also be selected from the group consisting of (i) hexamethyidisilazane and (ii) a silane of the formula $R'SiX_3$, wherein R' is alkyl having from about 1 to about 24 carbon atoms, and X is halogen. An exemplary silane is dodecyltrichlorosilane. The interfacial layer may be a self-assembled monolayer or multilayer.

In still further embodiments, $R_1$ and $R_2$ may be identical to each other and be alkyl having from about 8 to about 18 carbon atoms. $R_3$ and $R_4$ may also be identical to each other and be alkyl having from about 8 to about 18 carbon atoms. $R_1$, $R_2$, $R_3$, and $R_4$ may all be identical to each other and be alkyl having from about 8 to about 18 carbon atoms. In specific embodiments, $R_1$, $R_2$, $R_3$, and $R_4$ are $C_{12}H_{25}$. In further specific embodiments, R', $R_1$, $R_2$, $R_3$, and $R_4$ are identical to each other and are straight chain alkyl having from about 8 to about 18 carbon atoms.

The transistor may have a mobility of 0.1 $cm^2/V \cdot sec$ or more. The mobility may also be 0.25 $cm^2/V \cdot sec$ or more.

In other embodiments, a thin-film transistor is disclosed which comprises:
  a gate electrode, a source electrode, a drain electrode, a dielectric layer, an interfacial layer, and a semiconducting layer;
  wherein the interfacial layer is located between the dielectric layer and the semiconducting layer;
  wherein the dielectric layer is located between the gate electrode and the semiconducting layer;
  wherein the interfacial layer is formed from a silane of the formula $C_{12}H_{25}SiX_3$, where X is selected from Cl, $OCH_3$, and mixtures thereof; and
  wherein the semiconducting layer comprises a semiconductor of Formula (I):

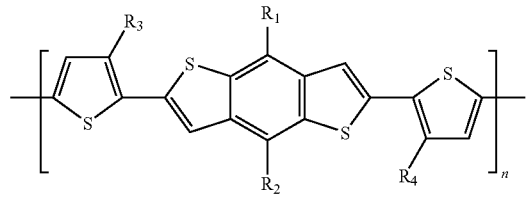

Formula (I)

wherein $R_1$ and $R_2$ are independently selected from alkyl, substituted alkyl, aryl, and substituted aryl; and $R_3$ and $R_4$ are independently selected from hydrogen, alkyl, substituted alkyl, aryl, and substituted aryl.

In still other embodiments, a process for forming an interfacial layer between a gate dielectric layer and a semiconductor layer of a thin film transistor is disclosed. The process comprises: providing a hydrophilic surface on the gate dielectric layer; providing a fresh silane solution; aging the silane solution at a relative humidity of from about 30% to 80% at a temperature of from about 25° C. to about 80° C. for from about 10 minutes to about 60 minutes; and coating the hydrophilic gate dielectric surface with the aged silane solution to form the interfacial layer.

Also included in further embodiments are the interfacial layers and/or thin film transistors produced by this process.

These and other non-limiting characteristics of the exemplary embodiments of the present disclosure are more particularly described below.

BRIEF DESCRIPTION OF THE DRAWINGS

The following is a brief description of the drawings, which are presented for the purpose of illustrating the exemplary embodiments disclosed herein and not for the purpose of limiting the same.

DETAILED DESCRIPTION

Figure 1:
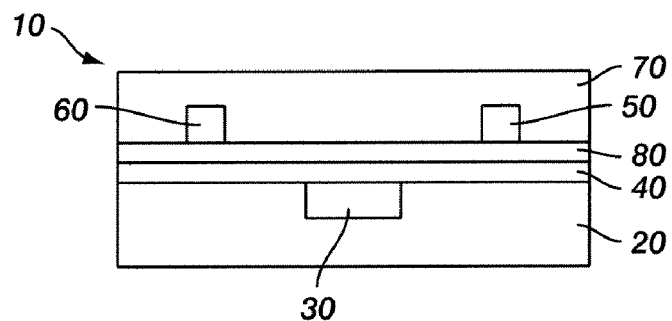
FIG. 1 is a first exemplary embodiment of an OTFT of the present disclosure.

A more complete understanding of the components, processes, and apparatuses disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

FIG. 1 illustrates a first OTFT embodiment or configuration. The OTFT 10 comprises a substrate 20 in contact with the gate electrode 30 and a dielectric layer 40. Although here the gate electrode 30 is depicted within the substrate 20, this is not required. However, of some importance is that the dielectric layer 40 separates the gate electrode 30 from the source electrode 50, drain electrode 60, and the semiconducting layer 70. The source electrode 50 contacts the semiconducting layer 70. The drain electrode 60 also contacts the semiconducting layer 70. The semiconducting layer 70 runs over and between the source and drain electrodes 50 and 60. Interfacial layer 80 is located between dielectric layer 40 and semiconducting layer 70.

Figure 2:
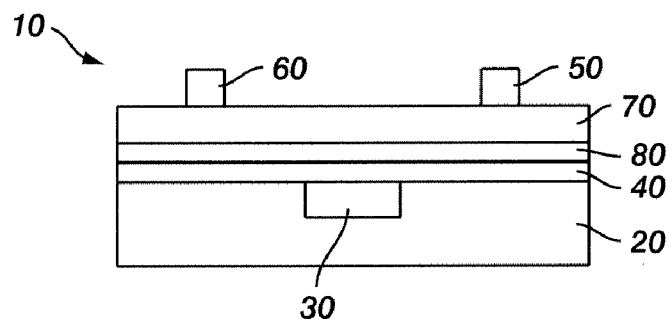
FIG. 2 is a second exemplary embodiment of an OTFT of the present disclosure.

FIG. 2 illustrates a second OTFT embodiment or configuration. The OTFT 10 comprises a substrate 20 in contact with the gate electrode 30 and a dielectric layer 40. The semiconducting layer 70 is placed over or on top of the dielectric layer 40 and separates it from the source and drain electrodes 50 and 60. Interfacial layer 80 is located between dielectric layer 40 and semiconducting layer 70.

Figure 3:
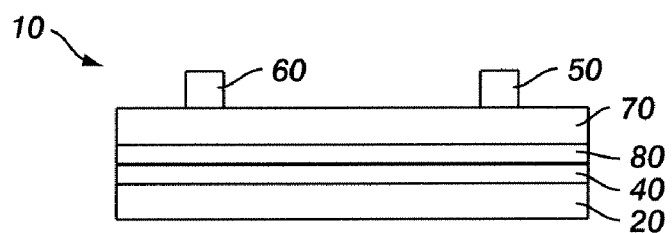
FIG. 3 is a third exemplary embodiment of an OTFT of the present disclosure.

FIG. 3 illustrates a third OTFT embodiment or configuration. The OTFT 10 comprises a substrate 20 which also acts as the gate electrode and is in contact with a dielectric layer 40. The semiconducting layer 70 is placed over or on top of the dielectric layer 40 and separates it from the source and drain electrodes 50 and 60. Interfacial layer 80 is located between dielectric layer 40 and semiconducting layer 70.

Figure 4:
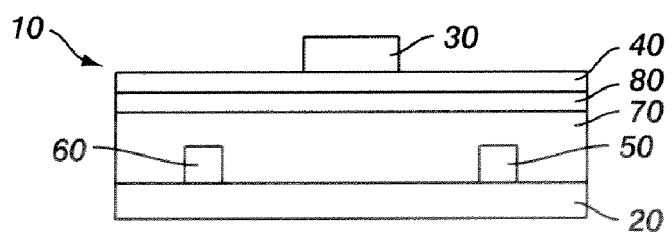
FIG. 4 is a fourth exemplary embodiment of an OTFT of the present disclosure.

FIG. 4 illustrates a fourth OTFT embodiment or configuration. The OTFT 10 comprises a substrate 20 in contact with the source electrode 50, drain electrode 60, and the semiconducting layer 70. The semiconducting layer 70 runs over and between the source and drain electrodes 50 and 60. The dielectric layer 40 is on top of the semiconducting layer 70. The gate electrode 30 is on top of the dielectric layer 40 and does not contact the semiconducting layer 70. Interfacial layer 80 is located between dielectric layer 40 and semiconducting layer 70.

The semiconducting layer comprises a semiconductor of Formula (I)

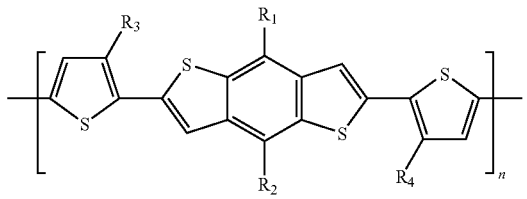

Formula (I)

wherein $R_1$ and $R_2$ are independently selected from alkyl, substituted alkyl, aryl, and substituted aryl; and $R_3$ and $R_4$ are independently selected from hydrogen, alkyl, substituted alkyl, aryl, and substituted aryl; and n is the degree of polymerization. This semiconductor is also known as a poly (benzo[1,2-b:4,5-b']dithiophene-co-bithiophene), or a benzodithiophene-thiophene copolymer.

In further embodiments, $R_1$, $R_2$, $R_3$, and $R_4$ are each alkyl, known as poly(4,8-dialkyl-2,6-bis(3-alkylthiophen-2-yl) benzo[1,2-b:4,5-b']dithiophene). In further specific embodiments, they are each alkyl having from about 8 to about 18 carbon atoms. In other embodiments, $R_1$ and $R_2$ are identical to each other; alternatively, $R_3$ and $R_4$ are identical to each other. Still further, $R_1$, $R_2$, $R_3$, and $R_4$ may each be selected from alkyl having from about 8 to about 18 carbon atoms. In one specific example, $R_1$, $R_2$, $R_3$, and $R_4$ are each $C_{12}H_{25}$. This particular semiconductor is known as PBTBT-12, and has the formula:

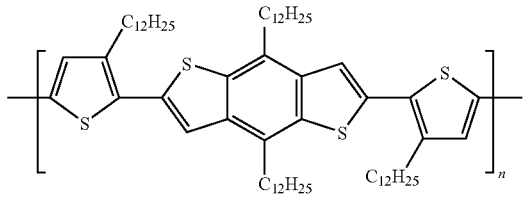

PBTBT-12

PBTBT-12 can be prepared as disclosed in U.S. patent application Ser. No. 11/586,449, filed on Oct. 25, 2006. That application is hereby fully incorporated by reference herein.

If desired, the semiconducting layer may further comprise another organic semiconductor material. Examples of other organic semiconductor materials include but are not limited to acenes, such as anthracene, tetracene, pentacene, and their substituted derivatives, perylenes, fullerenes, oligothiophenes, other semiconducting polymers such as triarylamine polymers, polyindolocarbazole, polycarbazole, polyacenes, polyfluorene, polythiophenes and their substituted derivatives, phthalocyanines such as copper phthalocyanines or zinc phthalocyanines and their substituted derivatives.

The semiconducting layer is from about 5 nm to about 1000 nm thick, especially from about 10 nm to about 100 nm thick. The semiconducting layer can be formed by any suitable method. However, the semiconducting layer is generally formed from a liquid composition, such as a dispersion or solution, and then deposited onto the substrate of the transistor. Exemplary deposition methods include liquid deposition such as spin coating, dip coating, blade coating, rod coating, screen printing, stamping, ink jet printing, and the like, and other conventional processes known in the art.

As charge transport in an organic thin film transistor occurs at the interface between the semiconducting layer and the dielectric layer, this interface is a critical part of determining the TFT's properties. In the devices of the present disclosure, an interfacial layer is located between the dielectric layer and the semiconducting layer to modify this interface. In particular, the interfacial layer is formed from a silane. The silane may be of Formula (II):

Formula (II)

where R' is alkyl having from about 1 to about 24 carbon atoms; R" is alkyl having from about 1 to about 24 carbon atoms, halogen, alkoxy, hydroxyl, or amino; L is halogen, oxygen, alkoxy, hydroxyl, or amino; k is 1 or 2; and m is an integer from 1 to 3. Generally, R" and L are leaving groups which allow the interfacial layer to form from the silane.

A non-limiting example of a silane of Formula (II) is hexamethyldisilazane (HMDS), where R'=CH$_3$, R"=CH$_3$, m=1, k=2, and L=NH. A more specific embodiment of Formula (II) is a silane of the formula R'SiX$_3$, wherein R' is alkyl having from about 1 to about 24 carbon atoms, and X is halogen, alkoxy such as OCH$_3$, and mixtures thereof (here, m=1, k=1, and L=R"=X). Usually, X is chlorine. In further embodiments, R' is alkyl having from about 8 to about 18 carbon atoms, particularly about 12 carbon atoms. In one specific embodiment, R' is C$_{12}$H$_{25}$ and X is chlorine. This particular silane is dodecyltrichlorosilane. Other exemplary silanes of the formula R'SiX$_3$ include octyltrichlorosilane and octadecyltrichlorosilane. Use of these interfacial layers significantly increases the carrier charge mobility of the overall OTFT.

In specific embodiments, the silane may be selected from the group consisting of (i) hexamethyldisilazane (HMDS); and (ii) a silane of the formula R'SiX$_3$, wherein R' is alkyl having from about 1 to about 24 carbon atoms, and X is halogen.

Figure 5A:
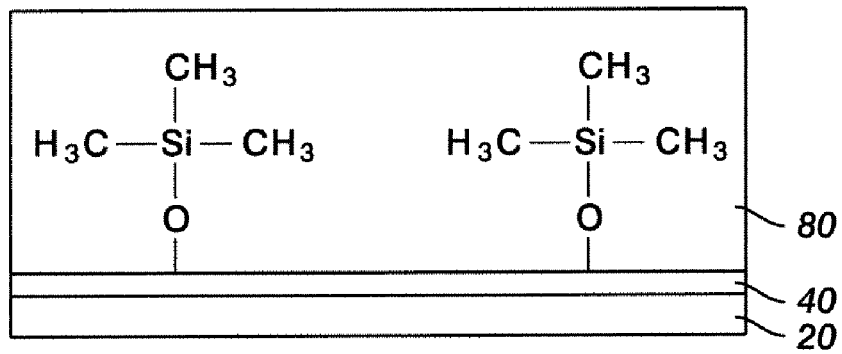
FIG. 5A is a first depiction of an interfacial layer used in the present disclosure.
Figure 5B:
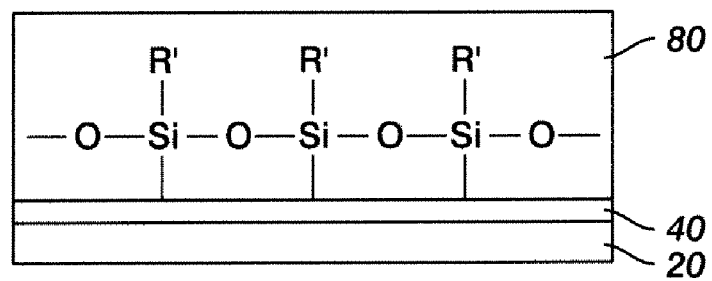
FIG. 5B is a second depiction of an interfacial layer used in the present disclosure.

These silanes will interact with a substrate to form a silanized interfacial layer having alkyl sidechains extending from the surface of the interfacial layer towards the semiconducting layer. Though not bound by this theory, it is believed that the presence of these alkyl sidechains, combined with the alkyl sidechains of the semiconductor material of Formula (I), result in the formation of lamellar sheets, which is beneficial to charge transport (and the consequent charge carrier mobility). The interfacial layer is believed to take the form of individual or interconnected silicon atoms having an R' sidechain extending from the surface. Exemplary depictions of the interfacial layer are shown in FIGS. 5A and 5B. In FIG. 5A, the interfacial layer is formed from HMDS and is believed to take the form of individual silicon atoms covalently bonded to the dielectric layer. Here, the sidechain is methyl. In FIG. 5B, the interfacial layer is formed from interconnected silicon atoms. Here, the interconnection results from oxygen atoms, which form a "siloxanized" interfacial layer. The R' sidechains are alkyl, such as octyl, dodecyl, and octadecyl. As a result, in some embodiments of the present disclosure, R$_1$=R$_2$=R$_3$=R$_4$=R', wherein R' is straight chain alkyl having from about 8 to about 18 carbon atoms. The interfacial layer formed may be either a monolayer or a multilayer, as the sidechains may interact with each other as well. In embodiments, the interfacial layer is a monolayer having a thickness from about 2 to about 30 angstroms. In other embodiments, the interfacial layer is a multilayer which has a total thickness of from at least 10 angstroms to about 100 angstroms, or from at least 20 angstroms to about 100 angstroms.

In embodiments, the interfacial layer is formed by providing a silane solution comprising silane and a solvent selected from the group consisting of aromatic hydrocarbons and aliphatic hydrocarbons. Exemplary hydrocarbons include, for example, toluene, xylene, heptanes, octane, decane, dodecane, ISOPAR G (available from ExxonMobil), and the like. The silane solution is aged at a relative humidity of from about 30% to 80%, especially from about 35% to 60%, at a temperature of from about 20° C. to about 80° C., especially from about 25 to about 60° C., for from about 10 minutes to about 60 minutes, especially from about 20 minutes to about 30 minutes. The concentration of the silane is from about 0.001 M to about 0.5M, or from about 0.01 to 0.1M. In embodiments, the solvent is toluene and the concentration is 0.1M. A hydrophilic surface of the gate dielectric layer is then coated with the aged silane solution to form the interfacial layer. The coating may be performed by spin coating, dip coating, bar coating, and the like. In particular, the aging step lowers the surface energy of the resulting interfacial layer. This can be seen in a higher advancing water contact angle. For example, using octyltrichlorosilane, the advancing water contact angle was increased from 90° without the aging step to 100° with the aging step. Though not bound by this theory, it is believed that the silane molecules react with each other during the aging step to form a silane network through hydrogen bonding. The hydrogen bonded network will react with hydroxyl groups at the surface of the dielectric layer to form the interfacial layer. Thus, a uniform interfacial layer can be achieved with no or little dependence on the uniformity of the hydroxyl groups on the surface of the dielectric layer.

The substrate may be composed of materials including but not limited to silicon, glass plate, plastic film or sheet. For structurally flexible devices, plastic substrate, such as for example polyester, polycarbonate, polyimide sheets and the like may be used. The thickness of the substrate may be from about 10 micrometers to over 10 millimeters with an exemplary thickness being from about 50 micrometers to about 5 millimeters, especially for a flexible plastic substrate and from about 0.5 to about 10 millimeters for a rigid substrate such as glass or silicon.

The gate electrode is composed of an electrically conductive material. It can be a thin metal film, a conducting polymer film, a conducting film made from conducting ink or paste or the substrate itself, for example heavily doped silicon.

Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite or silver colloids. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges from about 10 to about 500 nanometers for metal films and from about 0.5 to about 10 micrometers for conductive polymers.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about $10^{-12}$ Siemens per centimeter (S/cm) The dielectric layer is formed using conventional processes known in the art, including those processes described in forming the gate electrode.

Typical materials suitable for use as source and drain electrodes include those of the gate electrode materials such as gold, silver, nickel, aluminum, platinum, conducting polymers, and conducting inks. In specific embodiments, the electrode materials provide low contact resistance to the semiconductor. Typical thicknesses are about, for example, from about 40 nanometers to about 1 micrometer with a more specific thickness being about 100 to about 400 nanometers. The OTFT devices of the present disclosure contain a semiconductor channel. The semiconductor channel width may be, for example, from about 5 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of, for example, about 0 volt to about 80 volts is applied to the drain electrode to collect the charge carriers transported across the semiconductor channel when a voltage of, for example, about +10 volts to about −80 volts is applied to the gate electrode. The electrodes may be formed or deposited using conventional processes known in the art.

If desired, a barrier layer may also be deposited on top of the TFT to protect it from environmental conditions, such as light, oxygen and moisture, etc. which can degrade its electrical properties. Such barrier layers are known in the art and may simply consist of polymers.

The various components of the OTFT may be deposited upon the substrate in any order, as is seen in the Figures. The term "upon the substrate" should not be construed as requiring that each component directly contact the substrate. The term should be construed as describing the location of a component relative to the substrate. Generally, however, the gate electrode and the semiconducting layer should both be in contact with the dielectric layer. In addition, the source and drain electrodes should both be in contact with the semiconducting layer. The semiconducting polymer formed by the methods of the present disclosure may be deposited onto any appropriate component of an organic thin-film transistor to form a semiconducting layer of that transistor.

The resulting transistor may have, in embodiments, a mobility of 0.1 $cm^2$/V·sec or greater. In some embodiments, the mobility is 0.25 $cm^2$/V·sec or greater.

The following examples illustrate an OTFT made according to the methods of the present disclosure. The examples are merely illustrative and are not intended to limit the present disclosure with regard to the materials, conditions, or process parameters set forth therein. All parts are percentages by weight unless otherwise indicated.

Example

For some TFTs, an n-doped silicon wafer was used as the substrate to fabricate OTFT devices, wherein the n-doped silicon functioned as the gate electrode. For other TFTs, aluminum coated polyester was used as the substrate wherein the aluminum functioned as the gate electrode.

For some devices, polyvinyl phenol (PVP) layer was applied as the dielectric layer. For other devices, a blend of PVP and poly(methyl silsesquioxane) (PMSSQ) was applied as the dielectric layer.

The wafer surface was modified with four different interfacial layers. 0.1M silane solutions were made of hexamethyldisilazane (HMDS), octyltrichlorosilane (OTS-8), dodecyltrichlorosilane (DTS), and octadecyltrichlorosilane (OTS-18) in toluene. The solutions were aged at room temperature (23-25° C.) under a relative humidity of 40-50% for 30 minutes. Wafer surfaces were immersed into each solution at 60° C. for 20 minutes. The surfaces were washed with toluene, isopropanol, and air-dried in sequence. For the dielectric blend of PVP and PMMSQ, the surfaces were oxygen plasma cleaned for 1 minute and a 0.1 M DTS solution in toluene was spin coated on the plasma cleaned surface. After washing with toluene, the modified surface was dried on a hot plate at 60° C. for 20 minutes.

A semiconductor solution was prepared by dissolving 10 mg PBTBT-12 and 1 mg polystyrene (Mw=280,000) in 1 g dichlorobenzene with heating. PBTBT-12 has the chemical structure shown below.

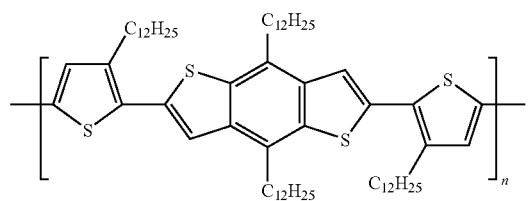

PBTBT-12

After filtering through a 0.45 μm syringe filter, the semiconductor solution was spin coated onto the above-modified wafer substrates at 1000 rpm for 90 seconds. After drying the solvent, gold source/drain electrodes were evaporated through a shadow mask on top of the semiconducting layer to complete the OTFT devices.

The devices were characterized with a Keithley 4200-SCS instrument at ambient conditions in the dark. Table 1 shows the composition of the various tested devices and the mobility and on/off ratio data for those devices.

TABLE 1

| Dielectric Layer | Interfacial Layer | Mobility (cm²/V · sec) | On/Off Ratio |
|---|---|---|---|
| SiO$_2$ | HMDS | 0.07 | $10^6$ |
| SiO$_2$ | OTS-8 | 0.18-0.22 | $10^7$ |
| SiO$_2$ | DTS | 0.23-0.34 | $10^7$ |
| SiO$_2$ | OTS-18 | 0.12-0.18 | $10^7$ |
| PVP/PMSSQ | None | 0.01-0.02 | $10^4$-$10^5$ |
| PVP | PMSSQ | 0.01-0.02 | $10^4$-$10^5$ |
| PVP/PMSSQ | DTS | 0.13-0.2 | $10^4$-$10^5$ |

An interfacial layer made from silane achieved higher mobilities. Specifically, the best mobility was achieved in the devices with an interfacial layer made of DTS.

Comparative Example

In this comparative example, DTS was used to form the interfacial layer on silicon wafer substrate. In contrast to the sample in Example 1, the dielectric surface was modified with a fresh solution of 0.1 M DTS in toluene. After completing the transistor, the mobility was measured to be 0.16-0.19 cm²/V·sec, which is much lower than the device having an interfacial layer made from an aged DTS solution.

The results showed that the devices having an interfacial layer made using aged dodecyltrichlorosilane (DTS) had the best mobility.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A thin film transistor comprising a dielectric layer, an interfacial layer, and a semiconducting layer;
  wherein the interfacial layer is between the dielectric layer and the semiconducting layer;
  wherein the interfacial layer is formed from a silane of Formula (II):

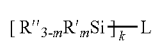

Formula (II)

and wherein the semiconducting layer comprises a semiconductor of Formula (I):

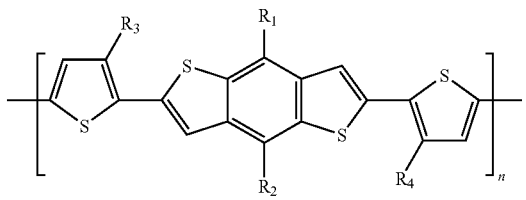

Formula (I)

wherein R$_1$, R$_2$, R$_3$, R$_4$, and R' are identical to each other and are straight chain alkyl having from about 8 to about 18 carbon atoms; wherein R" is alkyl having from about 1 to about 24 carbon atoms, halogen, alkoxy, hydroxyl, or amino; wherein L is halogen, oxygen, alkoxy, hydroxyl, or amino; wherein k is 1 or 2; and wherein m is an integer from 1 to 3.

2. The transistor of claim 1, wherein the silane is selected from the group consisting of (i) hexamethyldisilazane and (ii) a silane of the formula R'SiX$_3$, wherein R is alkyl having from about 8 to about 18 carbon atoms, and X is halogen.

3. The transistor of claim 2, wherein R' is C$_{12}$H$_{25}$ and X is chlorine.

4. The transistor of claim 1, wherein R' is alkyl having about 12 carbon atoms.

5. The transistor of claim 1, wherein R', R$_1$, R$_2$, R$_3$, and R$_4$ are C$_{12}$H$_{25}$.

6. The transistor of claim 5, wherein the interfacial layer is formed from dodecyltrichlorosilane.

7. The transistor of claim 6, wherein the interfacial layer is a self-assembled monolayer of dodecyltrichlorosilane.

8. The transistor of claim 6, wherein the interfacial layer is a self-assembled multilayer of dodecyltrichlorosilane.

9. The transistor of claim 1, wherein the transistor has a mobility of 0.1 cm²/V·sec or more.

10. The transistor of claim 1, wherein the transistor has a mobility of 0.25 cm²/V·sec or more.

11. The thin film transistor of claim 1; wherein the interfacial layer is formed from an aged silane solution containing the silane, the silane solution being aged at a relative humidity of from about 30% to 80% at a temperature of from about 25° C. to about 80° C. for from about 10 minutes to about 60 minutes, the silane solution then being used to form the interfacial layer.

12. A thin-film transistor, comprising:
  a gate electrode, a source electrode, a drain electrode, a dielectric layer, an interfacial layer, and a semiconducting layer;
  wherein the interfacial layer is located between the dielectric layer and the semiconducting layer;
  wherein the dielectric layer is located between the gate electrode and the semiconducting layer;
  wherein the interfacial layer is formed from a silane of the formula C$_{12}$H$_{25}$SiX$_3$, where X is selected from Cl, OCH$_3$, and mixtures thereof; and
  wherein the semiconducting layer comprises a semiconductor of Formula (I):

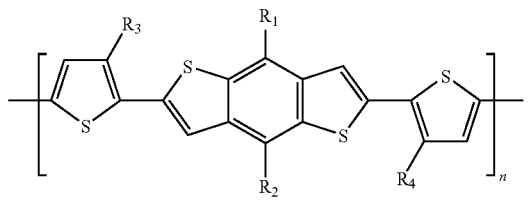

Formula (I)

wherein R$_1$, R$_2$, R$_3$, and R$_4$ are —C$_{12}$H$_{25}$.

13. The Thin Film Transistor of claim 12; wherein the interfacial layer is formed from an aged silane solution containing the silane, the silane solution being aged at a relative humidity of from about 30% to 80% at a temperature of from about 25° C. to about 80° C. for from about 10 minutes to about 60 minutes, the silane solution then being used to form the interfacial layer.

* * * * *